United States Patent [19]

Hesser

[11] Patent Number: 4,588,880
[45] Date of Patent: May 13, 1986

[54] NON-CONTACTING CODE RECOGNITION SYSTEM FOR CODE CARRIERS ON PRODUCTION LINE WORKPIECES

[75] Inventor: Paul Hesser, Freiberg, Fed. Rep. of Germany

[73] Assignee: Robert Bosch GmbH, Stuttgart, Fed. Rep. of Germany

[21] Appl. No.: 529,613

[22] Filed: Sep. 6, 1983

[30] Foreign Application Priority Data

Sep. 16, 1982 [DE] Fed. Rep. of Germany ....... 3234345

[51] Int. Cl.⁴ .............................................. G06F 15/46
[52] U.S. Cl. .................................... 235/376; 235/492; 340/825.23; 343/6.5 SS
[58] Field of Search ............... 235/375, 376, 454, 492, 235/449, 493; 364/468; 365/64; 340/825.23; 343/6.5 SS

[56] References Cited

U.S. PATENT DOCUMENTS

| 4,007,355 | 2/1977 | Moreno | 235/492 X |
| 4,194,686 | 3/1980 | Richter et al. | 235/376 |
| 4,242,663 | 12/1980 | Slobodin | 343/6.5 SS |
| 4,333,072 | 6/1982 | Beigel | 343/6.5 SS |
| 4,473,883 | 9/1984 | Yoshida et al. | 364/468 X |

FOREIGN PATENT DOCUMENTS 3012358  1/1981  Fed. Rep. of Germany .

Primary Examiner—David L. Trafton
Attorney, Agent, or Firm—Frishauf, Holtz, Goodman & Woodward

[57] ABSTRACT

To permit ready change of information on information carriers applied to workpieces which travel along a production line, for example to control further operating, machining or assembly steps, non-contacting sensors, typically inductive elements generating an electromagnetic field, transfer to a pick-up coil on the information carrier binary data. The information carrier includes a non-volatile permanent memory (ROM 25, 41) containing data characterizing the particular workpiece carrier or workpiece thereon, and a re-programmable, preferably non-volatile memory (RAM 27, 42) which contains added at the various operating stations to characterize operations, dimensions and the like of the respective workpiece and/or subsequent operations to be performed. The non-contacting transformer formed by the write/read stations and the pick-up coil (33, 47, 50) may, simultaneously, function as an energy transfer element to transfer operating energy for the memory units (23, 24, 40) on the workpiece carriers (11, 12) or the workpieces themselves (14, 15).

20 Claims, 4 Drawing Figures

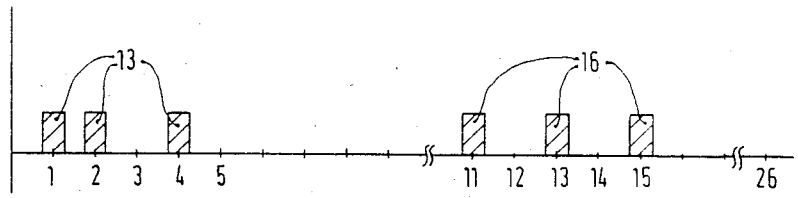
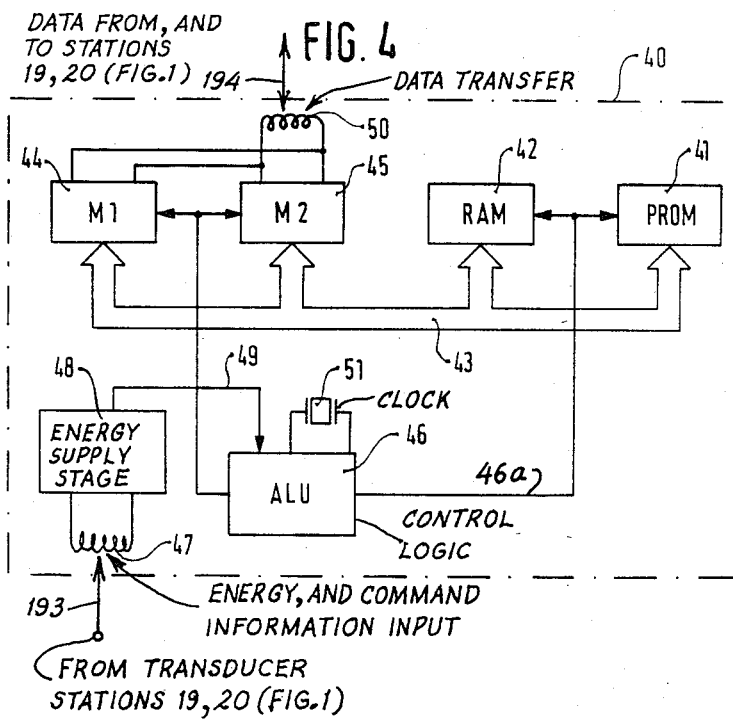

NON-CONTACTING CODE RECOGNITION SYSTEM FOR CODE CARRIERS ON PRODUCTION LINE WORKPIECES

REFERENCE TO RELATED PUBLICATION

German Patent Disclosure Document DE-OS No. 30 12 358, LEISNER & JUNG, assigned to the assignee of the present application.

The present invention relates to a coding system and code recognition system for workpieces which are carried on a production line, in which the workpieces, or the their carriers, are coded to indicate a characteristic, condition, status, parameter, orientation, designation or the like, which code is sensed by a non-contacting sensor located alongside the production line. The system is particularly adapted for automated assembly lines.

BACKGROUND

It has previously been proposed to associate workpieces, or workpiece carriers, which are placed on a production line to characterize the specific workpieces or workpiece carriers so that workpieces, for example on the carriers, can be properly sorted, oriented, and assembly, or ejected because they are out-of-tolerance and the like. It has also been proposed to change the code which is associated with the respective workpiece or workpiece carrier to indicate the status of its machining or assembly, and/or to place a code on the workpiece or the workpiece carrier to indicate what type of machining or working is to be carried out, or what type of assembly, or assembly steps, is to be carried out at a further working station. The information carrier, typically, carries the code in form of a binary digital number, that is, coded in bit patterns. Reading stations are located along the production line which have stationary non-contacting sensors to sense or recognize the respective code carried by the code carrier.

One such known coding arrangement has a block in which coding bolts are located. The block is, preferably, secured to a workpiece carrier. Coding and decoding are carried out by shifting the bolts which can move between two terminal positions. The position of the bolts is sensed or interrogated by sensors responsive, for example, respectively, to a projected or retracted position of a bolt, or projected in one geometrical position and retracted in another. The sensors may be of various types, for example inductive sensors, light-responsive sensors responding to reflected light, for example light reflected from an end facing surface of the bolt, by light gates in which a light beam is interrupted, or not, depending on the position of the bolt and the like.

The number of coding bolts can be increased if a plurality of such coding bolts are located above each other, or adjacent each other, so that the information data which are encoded can be enhanced. For example, a predetermined operating or working station can have a device which engages one of the bolts to change the position of the bolt, for example to press the bolt inwardly, after the respective working step or process at the working station has been carried out. A reading or sensing station located in advance of the next subsequent working station then recognizes that the workpiece has been properly worked-on before, and the workpiece is, accordingly, handled in the next station. Upon non-recognition, the workpiece, for example on the carrier, can be shifted to an alternate or reject path.

A specific workpiece carrier can be recognized, hence, in flexible production lines, for example with flexible assembly belts or transport elements on which similar, adjacently located workpiece carriers are passed through the line. The corresponding coding on the workpiece carrier, upon recognition, then indicates to a sensing arrangement which work processes, or what kind of machine, or subassembly, has already been carried out, so that the particular workpiece carrier can be properly routed to the next station on which work is to be carried out on the workpiece.

It has been proposed—see the referenced German Patent Disclosure Document DE-OS No. 30 12 358, LEISNER and JUNG, assigned to the assignee of the present application—to locate coding bolts in pairs, the position of the bolts being sensed by inductive sensors. The coding bolts, always paired, are so coupled to each other that, if one coding bolt is depressed into an information carrier, the other coding bolt will be pressed outwardly of the information carrier. Such coding systems operate well, but require comparatively large space, so that workpiece carriers which are small cannot accomodate a plurality of such coding bolts. The room available for extensive information carriers is limited. The distances between the coding bolts must be sufficiently large to prevent errors or ambiguities both on coding as well as on reading the information. Entering data, and reading information on the information carrier, is possible, at times, only when the workpiece carrier is stationary. While this may be the case at some working stations, it interferes in some instances with orderly handling and transport of workpiece carriers, and workpieces themselves. The coding bolts, being moved mechanically, are subject to wear, particularly if the coding is changed frequently. Dust, dirt, moisture, oil mist and the like, are endemic to manufacturing processes, and accuracy of coding by the coding bolts may suffer in such environments.

It has been proposed to provide optically readable coding systems. Such systems are used, particularly in order to determine contents and the like of packaged goods. The coding system is especially suitable for distribution of packaged items. A certain coding field carries a plurality of respectively thick and thin lines which can be sensed by optical sensors. Such coding systems are suitable for controlled, clean environments—for example in supermarkets. Change of the information to be placed on the code carrier is not possible, so that such systems are not suitable for production lines where the code is to be changed, for example each time the workpiece passes a work station.

Magnetic coding systems for use with workpiece carriers have been proposed, in which a comparatively intense magnetic field is applied to an information carrier, for example a magnetizable sinter material, or a metallic surface. The information is then sensed and decoded by means of Hall sensors, or inductive sensors. To obtain unambiguous readings, the sensors must be located close to the information carriers. This may cause difficulties, particularly in production lines in which the workpiece carriers are not securely guided along a rigid track, but are subject to wobble, sway, and the like. Such systems permit change of the coded information by applying an intense a-c field, in order to erase the magnetic information, and then re-record new information on the information carrier.

The packing density of information on the information carrier is limited due to stray fields which are unavoidable in factory production lines, so that, if a substantial number of coded data are to be transferred between the code carrier and the sensor, space for reading and recording may not be available. In metal-working production lines there is always the danger that iron filings and the like will adhere to the magnetized portions of the information carrier, thus interfering with reading of stored information. Dust, dirt and other contaminants also impair the accuracy and transfer of data between the code carrier and sensors.

THE INVENTION

It is an object to provide information carriers which can be applied to mobile workpieces or workpiece carriers which are small, can carry a large number of information data, and in which writing of code information is simple, and reading, and re-recording changed codes likewise is readily possible, with subsequent read-out of the changed data without ambiguity or difficulty.

Briefly, the information carrier which is applied to the workpiece or the workpiece carrier comprises an electronic memory unit. A transducer station is located adjacent the production line transport mechanism which includes means for transmitting data to the memory unit as well as for reading data stored in the memory unit. Input means are located on the memory unit for non-contacting transfer of data from the transducer station, and for recording the information in the memory unit. The memory unit includes an output circuit and element, located for non-contacting data transfer to the transducer station or a subsequent transducer station which may, but need not be, only a reading station. The transducer station, which cooperates with the output arrangement, permits scanning of data, for transmission of the data for further handling, in accordance with any well known and suitable arrangement, to control further production and/or assembly steps.

In accordance with a feature of the invention, at least one of the transducer stations includes means for supplying operating energy to the input means on the workpiece as well as the data. A suitable arrangement is an air gap-type transformer, that is, an induction coil at the transducer station and one on the workpiece, to provide charging energy to a small storage battery, a capacitor, or the like. Transfer of data and transfer of energy can be carried out essentially simultaneously.

The system has the advantage that the electronic memory units can be constructed as small compact elements, for example as integrated circuits including programmable read-only memories (PROMs) and/or random access memories (RAMs). Such memory units can be placed on tiny semiconductor chips while providing a large number of storage locations or blocks for a large number of process control data. The system is particularly applicable for control of production and/or assembly steps on automatic assembly lines having transport lines or belts, for example, between working stations.

The memory unit, in the form of a memory block, is insensitive to ambient conditions, such as moisture, contamination by dirt, and the like, and can be easily potted or encapsulated. It is essentially free from wear-and-tear.

Information can be entered into the storage blocks, depending upon their construction, either mechanically, electrically, electromagnetically or optically. Read-out can be carried out in serial or parallel mode, optically or electromagnetically. Change of the memory content due to external conditions, such as dirt, vibration, oscillation and the like, is not possible. The memory unit has a long lifetime without requiring particular attention or maintenance. The unit, further, permits information exchange between the memory unit and, for example, a central control station, which controls the overall production sequence or production line in order to optimize operation of the production line. The transfer frequency between the writing and read-out stations on the one hand, and the memory unit on the other, can be easily made sufficiently high so that the requisite information can be transferred as the workpieces move.

In accordance with a particularly preferred feature of the invention, the memory unit includes a PROM, with a non-volatile semiconductor memory, as well as a semiconductor RAM. The PROM will have written therein coded information relating to the particular workpiece carrier or workpiece; the RAM then may contain information which changes as production proceeds, for example in which each production step is encoded so that, additively, information can be recorded therein. This information may change at some production stations.

The type of random access memory which is used will depend on the respective arrangement which is selected, and on the power supply. Rather than using RAMs, re-recordable, non-volatile semiconductor memories, such as EAROMs, electronically erasable, programmable ROMs, or NOV-RAMs may be used, since these types of semiconductor memories retain information without requiring continuous energy supply.

DRAWINGS

FIG. 3 is a graph illustrating a bit pattern retained or stored in the memory unit of FIG. 2; and FIG. 4 illustrates another embodiment of a memory unit in which data input/output is in serial data transfer mode.

DETAILED DESCRIPTION

Figure 1:
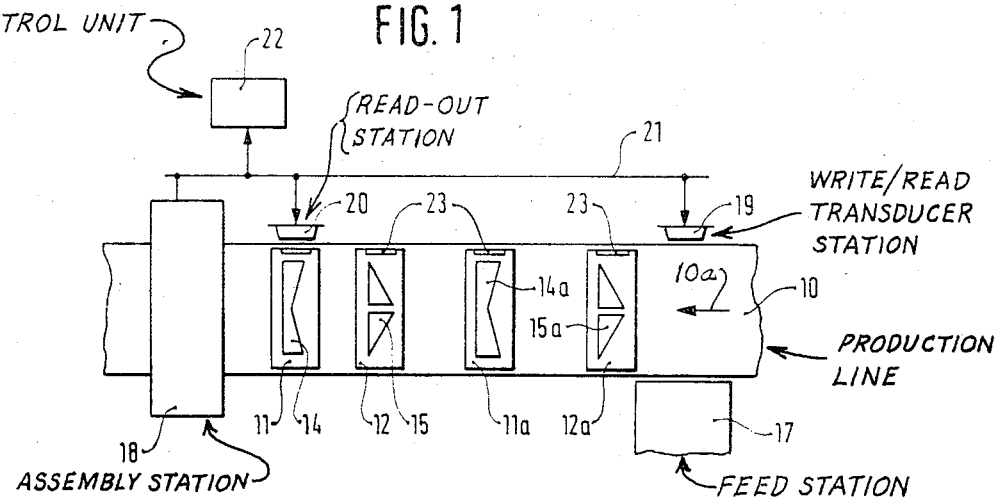
FIG. 1 is a schematic representation of a portion of a production line on which workpiece carriers are located, and showing the interaction between fixed stations and memory units on workpiece carriers.

A production line transport, for example a transport belt, chain, or the like, is schematically indicated at 10, FIG. 1, and is continuously moved in the direction of arrow 10a. A plurality of workpiece carriers 11, 11a, 12, 12a are secured to the transport belt or chain 10. The respective workpiece carriers carry different workpieces 14, 14a, 15, 15a, respectively. A feed station 17 feeds the workpieces 14, 15, 14a, 15a in alternating sequence to the transport belt 10 for assembly in an assembly station 18, in which the workpieces 14, 15 are assembled to a single unit.

A write/read transducer station 19 is located along the production line 10, for example opposite the feed station 17. A read-out station 20 is located in advance of the assembly station 18, at the same side of the production line 10 as the write/read transducer station 19. All transducer stations 19, 20, and other stations which may be placed along the production line, are connected together by an electrical cable or bus line 21 and to a data processing and production control unit 22, which may be of any suitable arrangement, to monitor and control the flow of workpieces along the production line, and working thereon. The write/read transducer station 19 and the read-out station 20, respectively, cooperate with an information code carrier unit 23, located at the side at which the transducer stations are positioned, for transducing interaction therewith, either on the workpiece carriers 11, 12, 11a, 12a, or on the workpieces 14, 15, 14a, 15a themselves. As shown, the information carriers are located on the workpiece carriers 11, 12 . . .

Basic operation: Let it be assumed that a workpiece carrier 12a is fed from the feed station 17 to the production line 10. The write/read transducer station 19 will first read the information stored in the memory unit 23. This information will identify the type of workpiece on the workpiece carrier. New information is entered by the writing portion of the transducer station to insure that the memory unit 23 will carry information regarding the next production step. When the workpiece carrier 12a reaches the next transducer station, as shown the read-out station 20, then the new information is read-out, and the information transmitted to the assembly station for assembly of the workpiece 15a on the carrier 12a with, for example, a workpiece 14a on a preceding workpiece carrier 11a. The writing and reading data transfer, thus, insures operation of the assembly station 18 only if the proper sequence of elements is being supplied thereto. In case of malfunction of the feed station 17, for example feed of two sequential workpieces of the type 15a, the transducer station 19 will recognize the type of workpiece being supplied which, in the program given, would be a malfunction and can then thus trigger an interlock or alarm or stop system in accordance with well-known interlock technology, for example by blocking of a conjunctive gate which opens only if alternate different workpieces 14, 15 are placed on the production line 10.

In accordance with a feature of the invention, the information carrier or code carrier 23 is constructed in the form of an electronic memory unit. The memory unit can be arranged in various ways.

Figure 2:
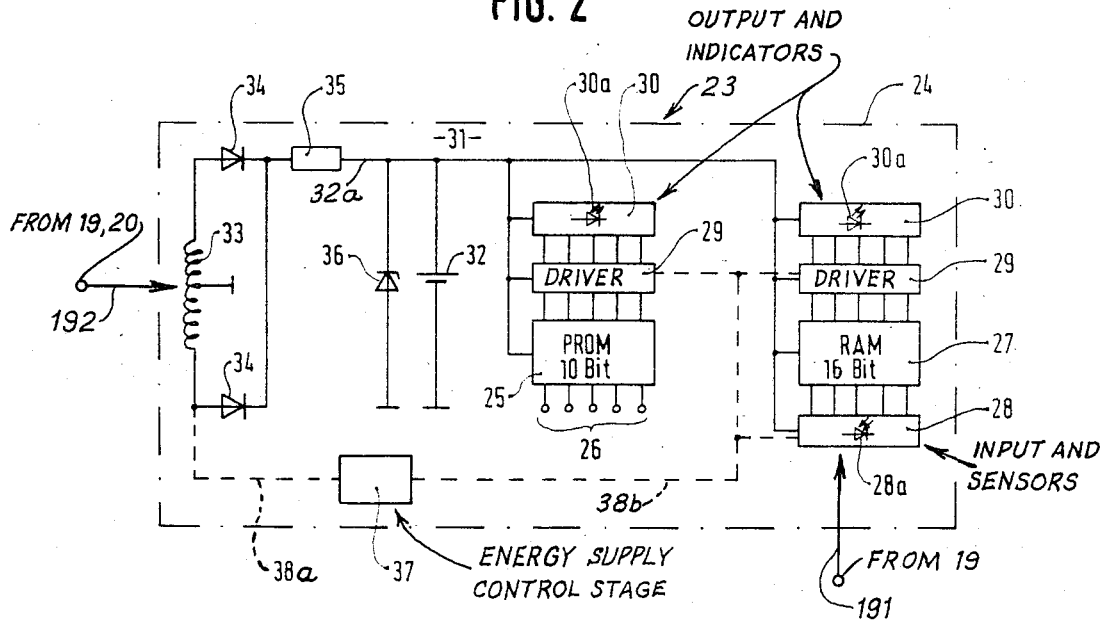
FIG. 2 is a detailed block diagram of a memory unit in accordance with the invention.

FIG. 2 illustrates an electronic memory unit 24 with parallel data transfer. The memory unit 24 has a programmable, non-volatile semiconductor memory 25 which, in its simplest form, is a PROM. The PROM 25 may, for example, contain ten bits of information which characterize the respective workpiece carrier 11, 12. This information is entered into the PROM 25 once by application of suitable voltages to the input terminals 26, and will remain in the carrier without change. In addition to the PROM 25, the carrier contains a semiconductor memory 27 in which the information can be changed or which can be reprogrammed. The memory 27, for example, can retain sixteen bits of information, which can be written therein as well as read out. Memory 27 as shown is an RAM. It has an input unit 28 which is coupled to sixteen separate sensors. These sensors—of which only one is shown symbolically in block 28—are, for example, photosensitive semiconductor elements such as photo diodes or photo transistors. Other elements may be used, such as Hall sensors, or other semiconductor elements which are responsive to an external influence, such as light, magnetic field or pressure-dependent semiconductor elements. The respective semiconductor sensors are coupled to appropriate amplifiers (not shown) in well-known manner, preferably integrated with the sensors, or part of an integrated circuit.

In the example, the input unit 28 has sixteen photo diodes 28a. PROM 25 and RAM 27 are connected, each, to respective driver stages 29 which, in turn, are connected to respective output indicators 30. The output indicators 20 which, connected to the PROM 25 are ten in number, and those connected to RAM 27 are sixteen in number, may, again, be semiconductor elements which emit optical or magnetic signals. In the example selected, the information output units 30 comprise ten and sixteen GAs diodes 30a to form the output indicators for the respective memory elements, the PROM 25 and the RAM 27. As will appear, the driver stages 29 may, additionally, have switching functions.

The semiconductor memories 25, 27 are formed as integrated circuits (ICs) on a substrate 31, for example a printed circuit (PC) board. Driver stages 29, as well as the input and output units 30, are also placed on the substrate 31 as integrated or discrete elements.

Power supply of all the electronic components is derived from a secondary battery 32 which receives power from an induction coil 33 and two rectifier diodes 34 and a protective resistor 35. A 5 V Zener diode 36 is connected across battery 32 to provide for voltage limiting. Operating energy is supplied to the induction coils 33 by another induction coil which is, respectively, located at the transducer stations 19, 20, and subjects coil 33 to a high-frequency magnetic field. The chargeable battery 32 thus can have only low storage capacity and, hence, can be small. For some applications, battery 32 can be replaced by a storage capacitor.

The energy supply required by the unit 24 will depend to some extent on the type of output indicator, or information output unit. Light emitting diodes (LEDs) have the advantage that the information stored in PROM 25 and in RAM 27 can be readily read-out as soon as supply voltage is applied. LEDs require, however, relatively high energy. Consequently, and in order to use energy transmitted to the memory units 24 economically, read-out of information can be controlled to occur only when the output indicators 30 are opposite a transducer station. An energy supply control stage 37 is connected to the inductance coil 33 by a connection line 38a. The output line 38b therefrom then is connected to control the drivers 29 to provide output voltage to the output indicators 30 only when energy is coupled through the coil 33 to the energy supply control stage 37. Thus, presence of the unit 24 opposite a transducer station 19, 20, in energy transfer coupled relationship, activates the driver stages and hence information output. Additionally, the energy supply control stage can be used to activate the input sensors 28 coupled to the RAM 27.

Information output units 30 with only low current consumption can also be used; for such elements, the induction coil 33 need be supplied with energy then only at the write/read transducer station 19, and the energy supply control stage, which is a logic unit, will be used to connect the input sensors 28 to the RAM 27 only for the period of time that the memory unit 24 is in energy coupled relation with the write/read transducer station 19.

The energy supply control stage, in its simplest form, can be a voltage-responsive switch, providing for connection of supply energy from supply bus 32a to the respective units 28, 29 only when voltage is applied at the input terminal.

Operation, with reference to FIG. 3: The memory unit 24, FIG. 2, may have a bit pattern as shown, for example in FIG. 3, stored therein. The first ten memory cells contain bit information 13 to characterize the respective workpiece carrier 11, 12 which, as described above, carries different workpieces for subsequent assembly. The subsequent memory positions or addresses 11 to 26 carry bit information relating to the workpiece itself which is located on the workpiece carrier. In the example selected, where two workpieces 14, 15 are to be assembled, addresses 11 and 12 may contain information relative to the respective workpieces 14, 15. The subsequent addresses 13 to 18 may contain information relative to stations which already have been passed by the respective workpieces to insure that, upon assembly, all prior production steps have been properly carried out. The remaining bits 19 to 26 may, for example, contain information regarding dimensions of the workpiece as actually measured, orientation or position of the workpiece, and the like.

FIG. 2 illustrates the arrangement in which information in the memory unit 24 is written and read-out, respectively, in parallel, that is, with high transfer speed. Information exchange at the write/read transducer station 19 and the read-out station 20 thus can easily be handled while the production line carrier 10 is moving, and even moving at high speed.

Information exchange can be carried out both parallel (FIG. 2) as well as serially (FIG. 4). Memory unit 40—see FIG. 4—has a PROM 41 and an RAM 42. RAM 42 may, for example, contain fifty address locations, so that fifty different information words can be stored therein. PROM 41 likewise has a plurality of memory addresses, so that a substantial number of information words can be stored. A data bus 43 connects PROM 41 and RAM 42 and is further connected to two multiplexers M1, 44, and M2, 45. Multiplexer M1, 44 is utilized as an information input unit for RAM 42. Multiplexer M2, 45 is used as an information output unit for the PROM 41, and as an information output unit for the RAM 42.

Control of the respective multiplexers 44, 45, as well as the respective semiconductor memories PROM 41 and RAM 42, is effected over a control logic ALU 46 and control line 46a, connected to the memories 41, 42.

Energy is transferred to the memory unit 40 over an induction coil 47 which is electromagnetically coupled to an induction coil at the respective transducer stations 19, 20. The transducer station 19, at least, provides a high-frequency magnetic field to transfer electromagnetic energy to the unit 40, where the energy is converted into suitable low-voltage direct current 48 for continuous voltage supply of the respective IC elements 41–46, for example similar to the circuit 32–36 of FIG. 2, and using a secondary or storage battery. The magnetic field may have a base frequency of, for example, 50 kHz. The 50 kHz frequency has command signals modulated thereon which are decoded in the energy supply stage 48 and applied over a line 49 to the control logic 46. The control logic has its own clock frequency generator 51, for example a quartz-controlled clock generator. The control commands, decoded or filtered or demodulated in the energy supply stage 48, are supplied to the control logic 46, which thus receives information whether (a) information is to be entered into RAM 42 via multiplexer 44, by serial writing;

(b) information stored in PROM 41 and in RAM 42 should be serially transmitted via multiplexer 45 for read-out. To write and read-out information, a data transfer coil 50 is connected to the respective multiplexers M1, M2, being connected to the input of multiplexer 44 as well as to the output of multiplexer 45.

The transmission clock rate of information transfer is determined by the clock frequency of the quartz oscillator 51 coupled to or part of the control logic 46.

Operation: Let it be assumed that a workpiece carrier 11 with the memory unit 40 is moved past the write/read transducer station 19. The high-frequency magnetic field generated at the write/read station 19 initially provides energy to the unit 40 by interacting electromagnetically with coil 47. This energy supply, by its very presence, also is information, since the control unit 46 thus is activated and learns that the unit 40 is opposite a write/read, or read station, respectively. The control logic 46, then, will control PROM 41, for example by closing a suitable switch, and multiplexer 45 to transmit the information stored in PROM 41 to identify the workpiece carrier 11, by providing serial pulses to the data output coil 50, for reception in suitable magentic sensors of station 19. Station 19 now knows and recognizes that a predetermined workpiece carrier 11 has reached the station 19. Station 19, then, will provide a command information, for example a frequency shift pulse or the like, to the coil 47 which is decoded in the energy supply stage 48 and transmitted to the control logic 46. Control logic 46 now, in accordance with any desired arrangement, for example, as hard-wired, will command the remaining data stored in PROM 41 and in RAM 42 for serial read-out via the data output coil 50. Of course, rather than reading-out all information, only selected information may be read out, which then will take less time. The information so received can be used by station 19 for further control or data transfer on the control bus 22, for testing for accuracy and, if necessary, to enter new information, e.g. to enter information that the respective workpiece carrier is opposite the station 19 and the information has been interrogated, and found in order. For example, new information to be written by station 19 in the unit 40 can be handled this way: First, a control command transmitted via the coil 47, for example in form of a frequency shift pulse, will control the control logic 46 to connect the multiplexer M1, 44, for reception of data in a predetermined address in the RAM 42. The information itself is then entered via coil 50 by serial pulses, received from station 19, and written at the predetermined addresss in RAM 42.

If desired, a further control command can be applied to coil 47, as above described, and the information just written can be read, for checking that it has been accurately written.

The memory unit 40, thus, can be brought up-to-date at any one of the stations where it cooperates with a transducer, and progress in respective production steps or measured results or the like can be entered in RAM 42 at suitable stations in the form of binary information.

Various changes and modifications may be made, and features described in connection with the memory units 24, 40 of FIGS. 2 and 4 may be used, respectively, in the others as well. For example, PROM 41 and RAM 42 may be coupled to an additional indicator, for example GAs-diodes; for less power consumption, read-out by a liquid crystal display (LCD) elements, may be used.

If the elements within the memory units 24, 40 are of low power consumption, it is possible to use power supply on the units themselves, for example by a primary battery, such as a button-cell or the like. In some installations, it is possible to eliminate the use of a storage battery or of a primary battery entirely, and to supply energy only when the respective memory unit is opposite the write and/or read transducer station 19, 20, since energy will be required only to change stored data. Energy supply, preferably, is by a high-frequency electromagnetic field. Energy supply of the memory units then, preferably, will be carried out via an induction coil, a rectifier, and a smoothing element, such as a capacitor.

Rather than using RAMs, non-volatile semiconductor memories such as EAROMs, EEPROMs, or NOV-RAMs, may be used. Such non-volatile semiconductor memories retain the information even in the absence of continuous voltage supply.

Energy supply, information transfer, and transfer of control commands can be effected over several different or only over a single induction coil, for example by modulating the magnetic field generated at the write and/or reading stations 19, 20 of, for example, 10 kHz, supplying energy, by temporally sequential control signals characterizing information which is to be written or to be read-out, by pulses of higher frequency, for example in the range of between 30–50 kHz.

Energy supply for the memory unit may also include a storage battery which, rather than being charged by a high-frequency magnetic field at the respective stations, is recharged when the workpiece carrier reaches a stop or rest point. At those instances, the storage battery can be automatically coupled to a charge unit for recharge thereof.

Inductive energy and data transfer is most suitable in productions lines which are located where they are mechanically or climatically stressed. In installations which can be operated under "clean" conditions, data transmission by optical data transfer is suitable. The distances between the writing and reading stations, respectively, and the workpiece carrier, can be increased with respect to electromagnetic data transfer.

The memory unit is constructed as a separate, removable module, secured to the workpiece or, preferably, to the workpiece carrier, or other carrier element. It should be so constructed that it can be readily separated from its support and exchanged. Modules always will have an input unit to write information in the electronic memory unit, as well as with an information output to read the contents of the memory, for example by stationary sensors, and should be compatible with the respective transducers or sensors at the writing and/or reading stations, respectively.

The memory unit is primarily suitable for use with workpieces in production lines, but it may be used for other applications as well. By suitable construction of the geometric and electrical characteristics of the transfer coils 33, 47, 50, the distances and distance tolerances between the coils and the respective transducer stations may be substantial. Thus, the system can be used with various components supplying, for example, storage or depository installations, or for removal of goods therefrom; it can also be used in transport technology, for supply, re-transmission and removal of goods and the like.

Various other changes and modifications may be made, and features described in connection with any one of the embodiments may be used with any of the others, within the scope of the inventive concept. Buffers, amplifiers, interlocks and isolating circuits to separate functions and elements have been omitted from the drawings since they would be used in accordance with good engineering practice, as well known.

In an operative embodiment using parallel data transfer, coil 33 was: 2×30 windings. The operating energy transferred to coil 33 was transmitted by a similar stationary coil at a frequency of: 1 MHz.

A suitable unit for PROM 25 is: Type 745 288 of Texas Instruments. A suitable unit for RAM 27 is: Type CD 40 114 of RCA. Suitable units for the driver units 29, the output indicator 30, and the input sensors 28a are: Type 7404 of Texas Instruments, HDSP 4820 of Hewlett & Packard, TIL 81 of Texas Instruments; speed of line 10: 30 cm/sec.

Suitable elements for the serial-data transfer unit of FIG. 4 are:

non-contacting transformer coils 47, 50: 20 and 30 windings energy supply and decoding stage 48: rectifier circuit with energy storage means and a high pass filter control logic 46: Type 6803 of Motorola PROM 41: Type 2516 of Texas Instruments RAM 42: Type MCM 14, 505 of Motorola multiplexers M1, M2, 44, 45: Type 74 189 of Texas Instruments coils 47, 50 and matching transfer coil on the transducer stations 19, 20: 20 and 30 windings gap separation between coils upon relative movement of line 10 and the fixed station: 2±1 mm speed of line 10: 10 cm/sec carrier frequency for energy transfer: 50 KHz modulation frequency indicating control bits: 1 MHz modulation frequency indicating data bits: 1 MHz The selection of the parallel- or serial-type read-out will depend primarily on speed of the production line, cost, and environmental conditions in which the production line operates. Under most commonly encountered conditions, serial-data transfer mode of FIG. 4 is preferred.

I claim:

1. Non-contacting code recognition system, to sense information data, characterizing conditions, status, parameters, orientation, designation, and the like, of workpieces (14, 15) on a transport line, and providing said information data to a stationary data processing and control stage (22), having a code information carrier (23; 24, 40) including storage means for storing said information data form of bit patterns, associated with said workpieces;

read-out means indicating the status of the stored bit pattern;

and at least one stationary transducer station (19, 20) having non-contacting sensing means, located in sensing relation with respect to said read-out means and sensing the bit pattern of information data indicated thereby, wherein, in accordance with the invention, the information carrier (23) comprises an electronic memory unit (24, 40) and a control logic (37);

one transducer station includes induction coil means (33, 47; 191, 192, 193, 194) for transmitting energy and data to the memory unit (24, 40) and command signals to said control logic;

the information carrier (23) further comprises input means (23, 33; 46–50) located in non-contacting data transfer relation to said at least one transducer station (19, 20) for recording information and storing said information in the memory unit (24, 40), an electronic memory section (25, 27; 41, 42) to store and receive information in the form of said bit pattern;

and output means (30; 44, 45, 50) located in non-contacting data transfer relation to said at least one transducer station to permit scanning of data supplied to the output means by the transducer station for transmission to said control stage; and said at least one transducer station (19) transmits energy by means of an alternating magnetic field having a basic frequency and transmits said command signals by superimposing a modulation, having a frequency different from said basic frequency, on said alternating magnetic field.

2. System according to claim 1, wherein the at least one transducer station (19, 20) includes means for supplying operating energy to the input means of the electronic memory unit (24, 40);

and the input means of the electronic memory unit includes means (32, 33-36; 47, 48) for accepting and storing operating energy supplied by the transducer station.

3. System according to claim 2, wherein the means for accepting and storing operating energy supplied by the transducer station comprises an electromagnetic non-contacting coupling element located on the information carrier, and means (32) for storing electrical energy supplied to the electromagnetic coupling element when a memory unit is positioned opposite a stationary transducer station, as said line moves, and transports the respective memory unit past the stationary transducer station.

4. System according to claim 2, wherein the data transfer between the at least one stationary transducer station (19, 20) and the memory unit (24, 40) of the information carrier (23), and energy transfer from the stationary transducer station (19, 20) to the information carrier (23) are carried out essentially simultaneously.

5. System according to claim 1, wherein the electronic memory section comprises a non-volatile, programmable semiconductor memory element (ROM) (25, 41).

6. System according to claim 1, wherein the electronic memory section comprises a non-volatile, programmable semiconductor memory (ROM) (25, 41) and a re-programmable semiconductor memory (RAM) (27, 42).

7. System according to claim 5, wherein said programmable non-volatile semiconductor memory includes a re-programmable, non-volatile semiconductor memory.

8. System according to claim 1, wherein the output means (30) comprises a plurality of light emitting semiconductor elements (30a).

9. System according to claim 1, wherein the output means (30) comprises an optical output indicator;

and the stationary transducer station includes means for reading and responsive to the optical indication furnished by said output means.

10. System according to claim 1, wherein the input means (28) comprises a plurality of semiconductor elements responsive to a physical quantity represented by at least one of: a magnetic field; light emission; pressure.

11. System according to claim 6, wherein the information carrier (23) additionally comprises a control logic (44) and an inductive non-contacting transformer (50), the electronic memory section (41, 42) being coupled (43, 44, 45) to said transformer for exchange of data with the stationary data processing and control station (22);

and said control logic (46) is connected (46a) to the electronic memory section to control respective transfer and exchange of data.

12. System according to claim 11, further including multiplex means (M1, 44) controlling transfer of information from the electronic memory section (41, 42) to the stationary transducer station (19, 20).

13. System according to claim 11, including two multiplexers (M1, 44; M2, 45) connected to said electronic memory and to said transformer (50);

and wherein one of the multiplexers (M1, 44) is controlled by the control logic (46) for transfer of data from the transducer station (19, 20) to the electronic memory section (41, 42), and the other multiplexer (M2, 45) controls transfer of data from the electronic memory section (41, 42) to the stationary transducer station (19, 20), said multiplexers and transfer of data being controlled by the control logic (46).

14. System according to claim 11, wherein the non-contacting transformer comprises a coil (47) coupled to the control logic (46);

and command data for the control logic (46) commanding operation thereof to control the electronic memory section, the input means (M1, 44, 50) and the output means (M2, 45, 50) for respective writing of data in the electronic memory section and read-out of data from the electronic memory section.

15. System according to claim 14, wherein the input means comprises an input multiplexer (M1, 44);

the output means comprises an output multiplexer (M2, 45), said multiplexers being connected to the electronic memory section (PROM, 41; RAM, 42) and controlled for respective writing or reading-out of information into and from the electronic memory section by said control logic.

16. System according to claim 1, wherein the at least one transducer station (19, 20) includes means for supplying operating energy to the memory unit (24, 40) including an induction or transformer coil (33, 47) coupled to receive electromagnetic energy from a high-frequency magnetic field generated by the at least one stationary transducer stage;

and an energy supply state including rectifier means (34, 35, 48) supplying rectified output energy to the electronic memory unit (24, 40).

17. System according to claim 16, wherein the information carrier further comprises a storage battery (32) receiving charging energy from said rectifier means, and supplying the input means, the electronic memory section and the output means of the memory unit (24, 40) with electrical energy.

18. System according to claim 16, wherein the electro-magnetic field generated by the at least one stationary transducer stage (19, 20) comprises a modulated high frequency of a predetermined carrier or base frequency, and modulation thereon, in which the modulation includes at least one of: command data; information data;

and decoding means (48) are provided, separating energy supply and data contents being transferred to the information carrier by the non-contacting transformer coil (33, 47).

19. System according to claim 18, wherein the information carrier (23) includes a control logic (37, 46) responsive to temporally sequential command signals transmitted thereto in the form of modulation of the high-frequency field applied to the non-contacting transformer, and further responsive to data transfer signals, said data transfer signals being represented by modulation of a frequency different from the base or carrier frequency of the high-frequency field.

20. System according to claim 19, wherein the information data are transferred between the memory unit (40) and the at least one stationary transducer station (20) in serial form, and the modulation frequency characterizing information data differs from the modulation frequency characterizing command data applied to the logic unit and controlling, respectively, transfer of data into and from the memory unit.

* * * * *